(12) United States Patent
Yun et al.

(10) Patent No.: US 7,812,320 B2
(45) Date of Patent: Oct. 12, 2010

(54) ION SOURCE ELEMENT, ION IMPLANTER HAVING THE SAME AND METHOD OF MODIFYING THE SAME

(75) Inventors: Su-han Yun, Hwaseong-si (KR); Jong-hyun Yang, Suwon-si (KR); Do-in Bae, Changwon-si (KR); Seong-gu Kim, Pyeongtaek-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 1039 days.

(21) Appl. No.: 11/521,534

(22) Filed: Sep. 15, 2006

(65) Prior Publication Data

US 2007/0075266 A1  Apr. 5, 2007

(30) Foreign Application Priority Data

Sep. 16, 2005  (KR) .................. 10-2005-0087015

(51) Int. Cl.
*H01J 27/00* (2006.01)

(52) U.S. Cl. .............. 250/423 R; 250/427; 250/492.21; 315/111.81; 315/111.71

(58) Field of Classification Search ............. 250/432 R, 250/427, 492.21; 315/111.81, 111.71
See application file for complete search history.

(56) References Cited

U.S. PATENT DOCUMENTS

| | | | |
|---|---|---|---|
| 5,497,006 A | * | 3/1996 | Sferlazzo et al. ............ 250/427 |
| 5,763,890 A | * | 6/1998 | Cloutier et al. ............. 250/427 |
| 5,821,677 A | * | 10/1998 | Benveniste ............. 313/231.41 |
| 7,138,768 B2 | * | 11/2006 | Maciejowski et al. .. 315/111.81 |

FOREIGN PATENT DOCUMENTS

| | | |
|---|---|---|
| JP | 09-063981 | 3/1997 |
| JP | 2001-160368 | 6/2001 |
| KR | 10-2005-0030007 | 3/2005 |

\* cited by examiner

*Primary Examiner*—Jack I Berman
*Assistant Examiner*—Meenakshi S Sahu
(74) *Attorney, Agent, or Firm*—Harness, Dickey & Pierce, P.L.C.

(57) ABSTRACT

An ion source element, an ion implanter having the ion source element and a method of modifying the ion source element are provided. In the ion source element, a chamber may have a cavity divided into a plurality of inner sections configured substantially perpendicularly to an axis defined through centers of ends of the cavity. The larger inner sections may be at, or near, a center of the cavity and become smaller toward the ends of the cavity. A filament may be disposed at one end of the chamber to emit thermal electrons. A repeller may extend into the chamber through the other end of the chamber. An inlet may be formed in a first cavity wall to introduce gas having a dopant species into the chamber. A beam slit may be formed in a second cavity wall, opposite the inlet, of the chamber to extract an ionized species of the gas from the chamber.

21 Claims, 8 Drawing Sheets

ION SOURCE ELEMENT, ION IMPLANTER HAVING THE SAME AND METHOD OF MODIFYING THE SAME

PRIORITY STATEMENT

This application claims the benefit of priority under 35 U.S.C. §119 from Korean Patent Application No. 10-2005-0087015, filed on Sep. 16, 2005, in the Korean Intellectual Property Office, the disclosure of which is incorporated herein by reference in its entirety.

BACKGROUND OF THE INVENTION

1. Field of the Invention

Example embodiments of the present invention relate to an ion source element, an ion implanter with the ion source element, and a method of modifying the ion source element.

2. Description of the Related Art

Properties of a semiconductor may be altered by projecting an ion beam on the semiconductor device. The ion beam may be generated by a device known as an ion implanter. The implanter may implant ions into the wafer to form a conductive layer in the wafer. For example, a proper mask layer (e.g., a photoresist) may be formed on a wafer except in a region where an impurity region may be formed.

The ion beam may be generated from an ion source element in an ion implanter. The ion source element may receive gas from a gas cabinet coupled to the ion source element and may generate dopant ions which may be doped into a wafer.

FIG. 1 is a sectional view of a conventional ion source element of an ion implanter.

Referring to FIG. 1, an ion source element 10 may include a chamber 11 confined by a cuboidal housing with sidewalls 1, end wall 2a and end wall 2b; a filament 12 extended into the chamber 11 through the end wall 2a; and a repeller 13 extended into the chamber 11 through the end wall 2b. When the ion source element 10 operates, the filament 12 may be heated by a current to emit thermal electrons. Negative biases may be applied to the filament 12 and the repeller 13 with respect to the housing. The ion source element 10 may further include a magnet (not shown) generating a magnetic field (B). The magnetic field (B) may force the electrons emitted from the filament 12 to move in a spiral path when the electrons are accelerated by an electric field formed by the bias, increasing ionization efficiency. Source gas with a dopant may be introduced into the chamber 11 through an inlet 14. The introduced source gas may be dissociated by the electrons and/or ionized to form plasma. Positive ions $P^+$ and $P^{++}$ may be extracted from the chamber 11 through a beam slit 15 by an electric field. The electric field may be formed by an extraction electrode (not shown) disposed outside the chamber 11. The ions passed through the beam slit 15 may be implanted into a wafer in the form of a beam.

The throughput of ion implantation process may depend on the current density of an ion beam colliding with the wafer. If the power to the filament is increased in order to increase the current density of the ion beam for higher throughput, the lifetime of the filament or a similar component may decrease.

SUMMARY OF THE INVENTION

Example embodiments of the present invention provide an ion source element, ion implanter having the ion source element and a method of modifying the ion source element. Example embodiments of the present invention provide a method of modifying the ion source element that may generate an improved ion beam current with a low input power to increase the productivity and lifetime of the ion source element.

Other example embodiments of the present invention provide an ion source element that may generate an improved ion beam current with a low input power to increase the productivity and lifetime of the ion source element and/or an ion implanter with the ion source element.

According to example embodiment of the present invention, there is provided an ion source element that may include a chamber having a cavity divided into a plurality of inner sections configured substantially perpendicularly to an axis defined through centers of ends of the cavity, the inner section with the largest diameter being at, or near, a center of the cavity and the inner sections becoming smaller toward the ends of the cavity; a filament disposed at one end of the chamber to emit thermal electrons; a repeller extending into the chamber through the other end of the chamber; an inlet formed in a cavity wall of the chamber to introduce gas having a dopant species into the chamber; and a beam slit formed in the cavity wall of the chamber to extract an ionized species, produced from the gas, from the chamber.

The inner section may be circular. The inner section may symmetrically decrease towards the ends of the chamber with respect to a center of the chamber. The cavity of the chamber may have an ellipsoidal shape. As a result, the ion source element of the present invention may more efficiently confine, or concentrate, plasma in or near the center of the chamber to increase uniformity of the plasma and ion density locally.

The filament may extend from an outside of the chamber into the cavity of the chamber through the end of the chamber. The ion source element may further include a cathode disposed at the same end of the chamber as the filament. The cathode may have an internal, or rear, surface facing the filament and an external, or front, surface facing the cavity. The external surface of the cathode may emit thermal electrons toward the cavity of the chamber when the internal surface of the cathode is heated by the thermal electrons emitted from the filament. According to example embodiments of the present invention, the filament may have a longer lifetime because the filament may indirectly be exposed to the plasma.

The inlet, which may be formed in the cavity wall of the chamber, may be placed approximately in the center portion of the cavity of the chamber. The beam slit, which may be formed in the cavity wall of the chamber, may also be placed approximately in the center portion of the inner space, or cavity, of the chamber. The inlet and the beam slit may face each other to increase ionization efficiency and/or an ion beam current extracted through the slit.

The ion source element may further include a magnet and/or a magnet coil forming a magnetic field in the chamber from one end of the chamber across to the opposing end of the chamber. The magnetic field may force the electrons to move in a spiral path. As a result, the distance traveled by the electrons may increase, increasing the possibility of collisions between the gas molecules and the electrons. Thereby, increasing the ion beam current extracted through the beam slit.

The chamber may be formed of a material selected from tungsten (W), molybdenum (Mo) and/or graphite. If the ion source element includes the magnet and/or the magnet coil, then the chamber may be formed of a non-magnetic material to allow a magnetic flux from the magnet and/or the magnet coil to pass through the chamber sidewall into the cavity of the chamber. For example, the chamber may be formed of stainless steel.

According to other example embodiment of the present invention, an ion source element may include a chamber having at least three inner sections disposed parallel to each other. The largest cross-sectional area of the chamber may be located at a center of the chamber and become smaller towards walls of the chamber. The ion source may also include a filament disposed substantially perpendicularly to the at least three inner sections to emit thermal electrons; a repeller disposed substantially opposite to the filament such that the repeller faces the filament; an inlet formed in the walls of the chamber to introduce gas having a dopant species into the chamber; and/or a beam slit formed in the walls of the chamber to extract an ionized species of the gas from the chamber.

According to other example embodiments of the present invention, there is provided a method of modifying an ion source element, the method may include providing a first chamber having a first cavity previously installed in a ion source element; measuring an inner volume of the cavity of the first chamber, forming a second chamber having a second cavity divided into a plurality of inner sections arranged by size and disposed substantially perpendicularly to an axis defined through the centers of a first and a second end of the second chamber, the inner section with the largest diameter being located at a center portion of the second chamber and becoming smaller toward the ends of the second chamber; and modifying the ion source element by replacing the first chamber with the second chamber.

The inner section may be circular. The inner section may symmetrically decrease towards the ends of the second chamber with respect to the center of the second chamber. The cavity may have an ellipsoidal shape. As a result, plasma may be more efficiently confined, or concentrated, in or near the center portion of the chamber by improving the ion source element of the ion implanter, increasing the uniformity of the plasma while increasing ion density locally.

BRIEF DESCRIPTION OF THE DRAWINGS

Example embodiments of the present invention will be more clearly understood form the following detailed description taken in conjunction with the accompanying drawings. FIGS. 1-9 represent non-limiting example embodiments of the present invention as described herein.

FIG. 1 is a sectional view illustrating a conventional ion source element of an ion implanter;

FIG. 2 is a perspective view illustrating an ion source element for an ion implanter according to example embodiments of the present invention;

FIG. 3 is a perspective view illustrating an ion source element according to example embodiments of the present invention;

FIG. 7 is a perspective view illustrating an ion source element according to example embodiments of the present invention;

FIG. 8 is a plan view schematically illustrating an ion implanter with an ion source element according to example embodiments of the present invention; and FIG. 9 is a flowchart illustrating a method of modifying an ion source element according to example embodiments of the present invention.

DETAILED DESCRIPTION OF EXAMPLE EMBODIMENTS

Figure 1:
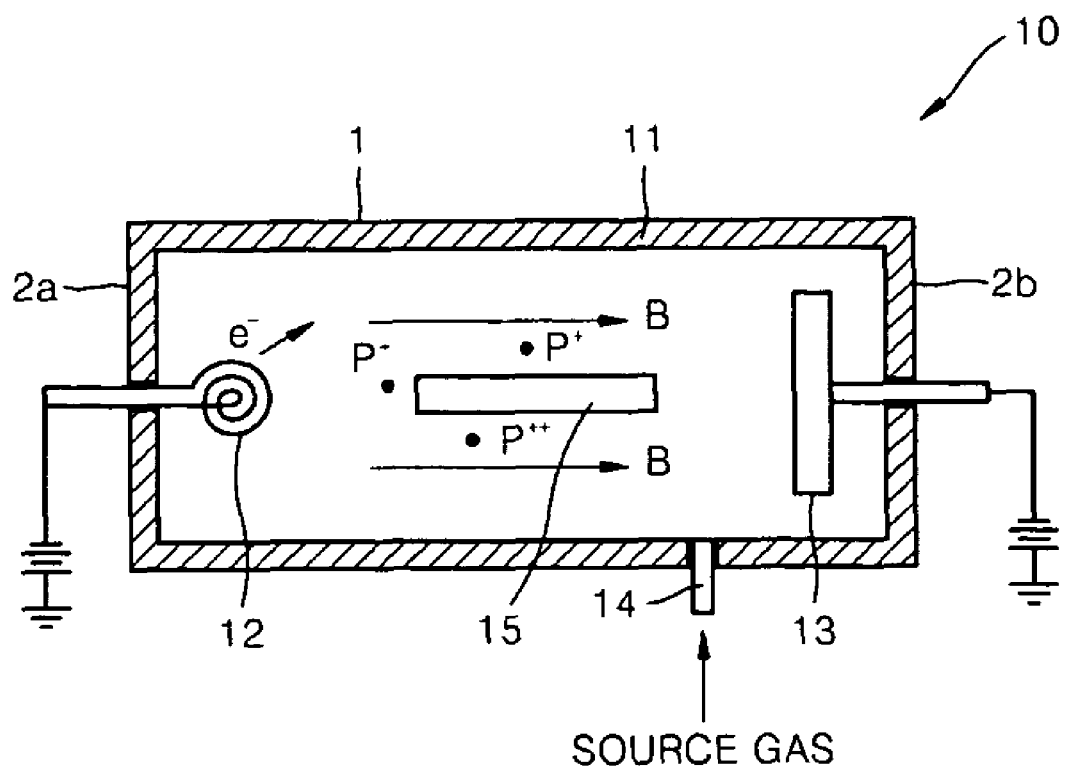

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath," "below," "lower," "above," "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described. In the figures, if a layer is formed on another layer or a substrate, it means that the layer is directly formed on another layer or a substrate, or that a third layer is interposed therebetween. In the following description, the same reference numerals denote the same elements.

Example embodiments of the present invention provide an ion source element, ion implanter having the ion source element and method of modifying the ion source element.

Figure 2:
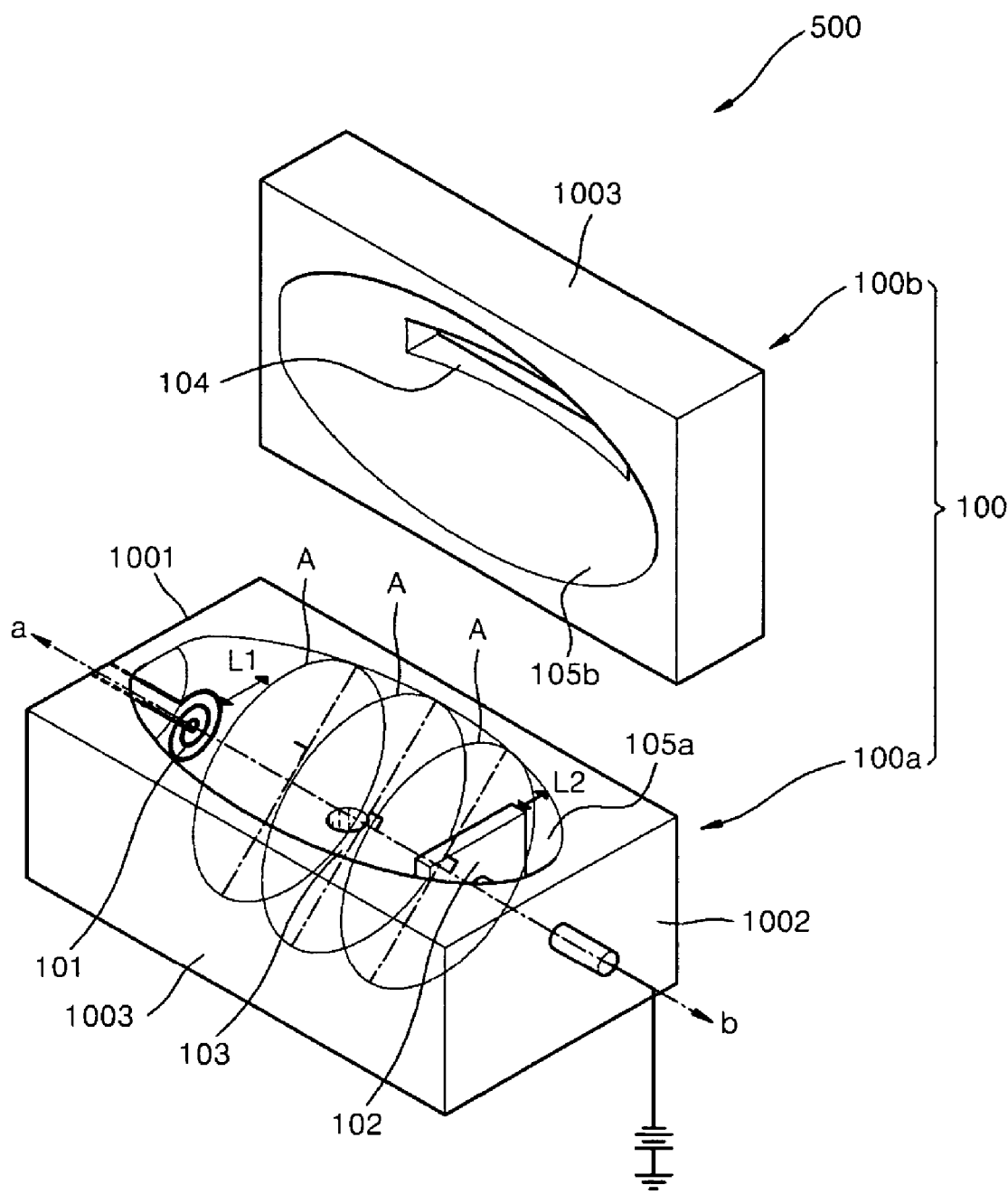

Other example embodiments of the present invention provide an ion source element that may generate an improved ion beam current with a low input power to increase the productivity and lifetime of the ion source element, and an ion implanter with the ion source element FIG. 2 is a perspective view illustrating an ion source element for an ion implanter according to an example embodiment of the present invention.

Referring to FIG. 2, an ion source element 500 may include a filament 101, a repeller 102 and/or a chamber 100. The filament 101 and the repeller 102 may be positioned, or deposited, at the end 1001 and 1002 of the chamber 100, respectively. The filament 101 may emit thermal electrons. The thermal electrons may initiate the generation of plasma when a bias is applied. The filament 101 may extend into the chamber 100 from an outside of the chamber 100 through the end 1001. The filament 101 and the repeller 102 may be spaced a distance L1 and L2 respectively from cavity walls, reducing unnecessary arc discharge.

Arc discharge is a type of electrical conduction in gases characterized by high current density and low change in potential. Arc discharge may be accompanied by plasma discharge. Arc discharge differs from plasma discharge in the arc discharge is a result of electrical conduction of gas and plasma discharge is a type of state (e.g., phase) of gas.

If arc discharge occurs between the filament 101 and the cavity walls 105a and 105b (or between the repeller 102 and the cavity walls 105a and 105b) of the chamber, then the filament 105, the repeller 102 and/or the cavity walls 105a and 105b may be heated to a temperature sufficient to vaporize the filament 105, the repeller 102 and/or the cavity walls 105a and 105b, respectively. Vaporization may lead to contamination, a shorter lifetime and/or lower ion current of an ion source element.

The chamber 100 may include a lower body 100a accommodating an inlet 103 and/or an upper body 100b formed with a beam slit 104 at the sidewall 1003. The lower body 100a may accommodate some of the filament 101, the repeller 102 and/or the inlet 103 for convenience of modifying the ion source element 500. By coupling the upper body 100b and the lower body 100a, the chamber 100 of the ion source element 500 may be formed. Alternatively, the ion source element 500 may be one unit formed as one piece or as at least three coupled pieces (e.g., by coupling the sidewall 1003 and the ends 1001 and 1002 of the chamber 100).

The chamber 100 may include a cavity divided into inner sections (A). The inner sections (A) may be configured substantially perpendicularly to an axis "a-b" defined through the centers of ends 1001 and 1002 of the cavity. Inner section (A) may have a maximum diameter at and near the center of the cavity. Inner section (A) may become smaller toward the ends 1001 and 1002.

The volume of the cavity of the chamber 100 may be equivalent, or similar, to that of a cuboidal, or cylindrical, cavity of a conventional chamber. The portion of the volume of cavity near the center of the chamber 100 may be greater than the portion of the volume of the cavity near the ends 1001 and 1002 of the chamber 100.

When it is considered that the loss of electrons and/or ions usually happen mainly at the ends of a chamber, the chamber 100 of the present invention can reduce the loss of the electrons and ions by reducing the portion of the cavity neat the ends 1001 and 1002 of the chamber 100. Due to more active ionization near the center of the cavity, the chamber 100 may have improved ion density and/or ionization efficiency at, and near, the center of the cavity 100. Due to decreasing ion density near the ends 1001 and 1002 of the chamber 100, the occurrence of arc discharge between the filament 101 and/or the repeller 102 and the cavity wall 105 may be reduced, improving electrical stability in the chamber 100.

The inner sections (A) may be circular. The areas of the inner sections (A) may decrease symmetrically toward the ends 1001 and 1002. The cavity of the chamber 100 may have an ellipsoidal shape. The filament 101 and the repeller 102 may be disposed on the major axis "a-b" of the ellipsoidal cavity. According to example embodiments of the present invention, when the ion source element operates, plasma may be more confined, or concentrated, in the center portion of the chamber 100, increasing the uniformity of the plasma.

The filament 101 may be positioned, or deposited, at the end 1001 of the chamber 100. The filament 101 may emit thermal electrons. The thermal electrons may initiate the generation of plasma when a bias is applied. The filament 101 may extend into the chamber 100 from an outside of the chamber 100 through the end 1001.

Figure 3:
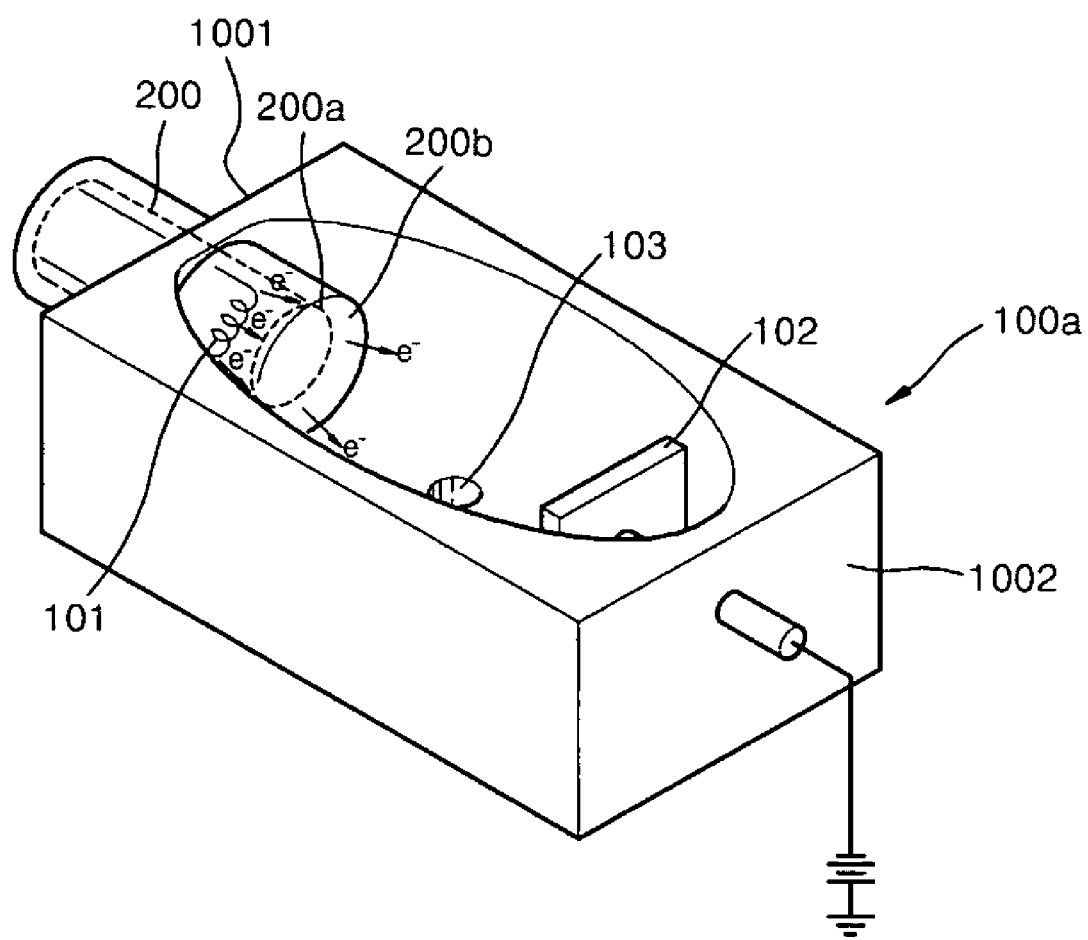

FIG. 3 is a perspective view illustrating an ion source element according to example embodiment of the present invention.

Referring to FIG. 3, an ion source element 500 may include a cathode 200 that encloses the filament 101 at a distance from the filament 101. The cathode 200 may be disposed at the end 1001 of the chamber 100. An internal, or rear, surface 200a of the cathode 200 may be heated by collision with electrons emitted from the filament 101 facing the internal surface 200a. This may cause an external, or front, surface 200b of the cathode 200 facing the inside of the chamber 100 to emit thermal electrons. The filament 101, enclosed in the cathode 200, may have a longer lifetime compared to an ion source element in which the filament may be exposed to the plasma. The cost and frequency of repair and/or maintenance of an implanter with the ion source element containing a cathode enclosing a filament may be reduced.

Figure 4A:
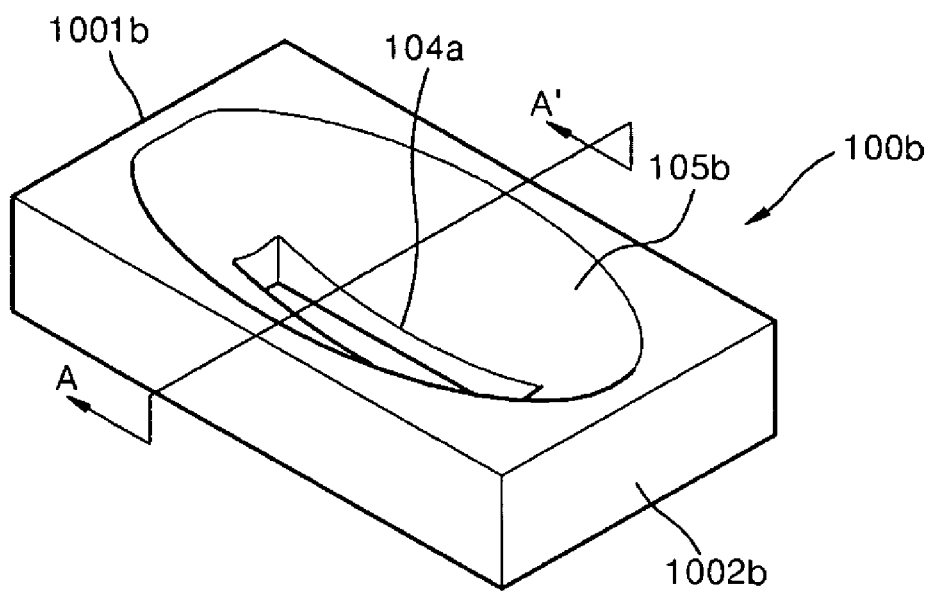
FIGS. 4A and 4B are perspective views illustrating shapes of beam slits of ion source elements according to example embodiments of the present invention.
Figure 4B:
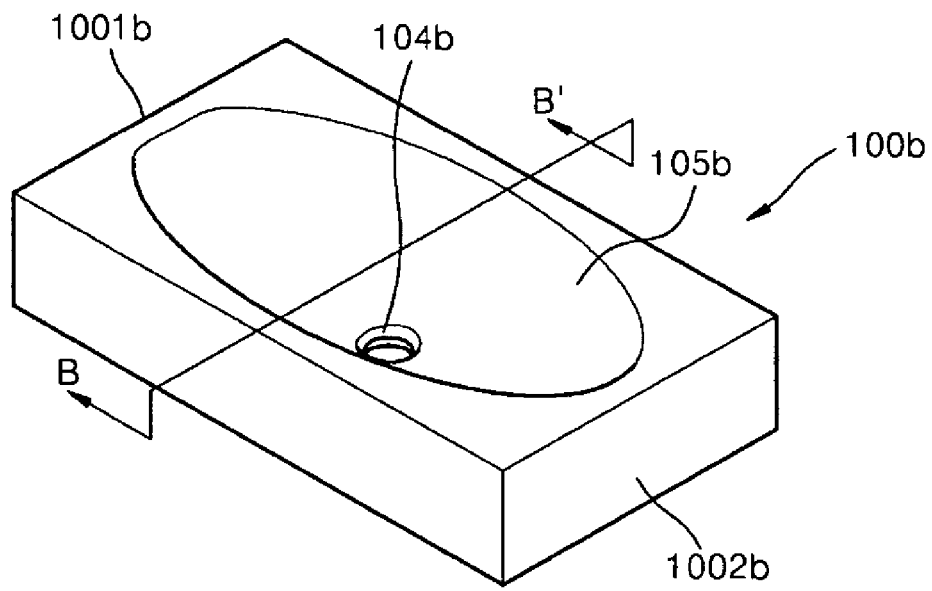

FIGS. 4A and 4B are perspective views illustrating shapes of beam slits of ion source elements according to example embodiments of the present invention.

Referring to FIGS. 4A and 4B, the beam slits 104a and 104b may have a narrow rectangular shape and a circular shape, respectively. Each of beam slits 104a and 104b may be formed substantially at the cavity wall 105b of the center portion of the cavity of the upper body 100b. As shown in FIG. 4A, the length of the rectangular beam slit 104a may extend toward the ends 1001b and 1002b of the upper body 100b. The inlet 103 (shown in FIG. 2) may be disposed at the cavity wall 105a of the center portion of the cavity of the lower body 100a (shown in FIG. 2) of the chamber 100, respectively, to face the inlet 103 and the beam slits 104a and 104b. After ionization of gas introduced into the chamber 100 through the inlet 103, the ionized species may be more easily extracted through the beam slits 104a and 104b.

Figure 5A:
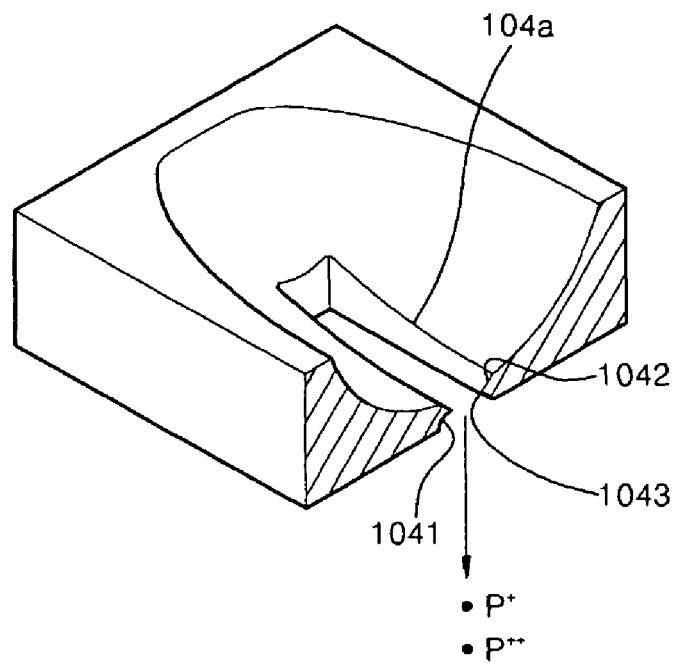
FIGS. 5A and 5B are cut-away perspective views taken along the line A-A' of FIG. 4A and the line B-B' of FIG. 4B, respectively.
Figure 5B:
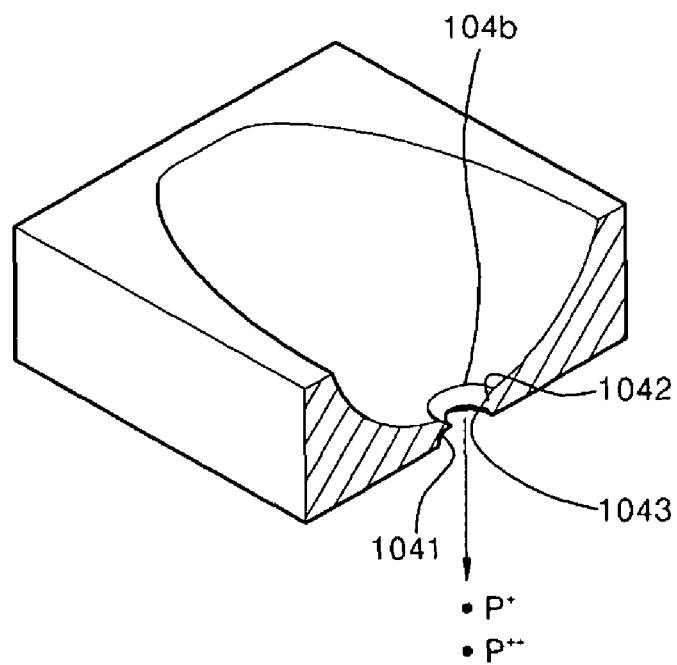

FIGS. 5A and 5B are cut-away views taken along the line A-A' of FIG. 4A and the line B-B' of FIG. 4B, respectively. Referring to FIGS. 5A and 5B, each of the beam slits 104a and 104b may include a concave surface 1041 facing the outside of the chamber 100 and a sharp corner 1043 with a sloped surface 1042 facing the inside of the chamber 100.

Experimental results show that when the beam slits 104a and 104b have the above-described structure, ion beams may be more easily extracted through the beam slits 104a and 104b and/or more easily focused to restrain arc discharge effectively, obtaining more ion beam current from the same input power.

Figure 6A:
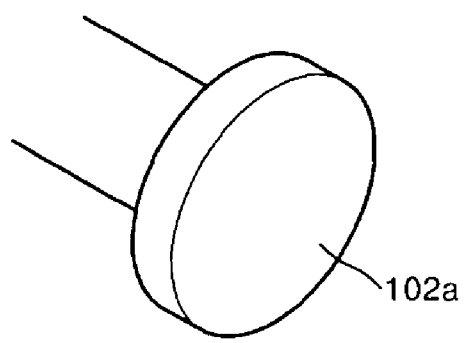
FIGS. 6A and 6B are perspective views illustrating repellers of ion source elements according to example embodiments of the present invention.
Figure 6B:
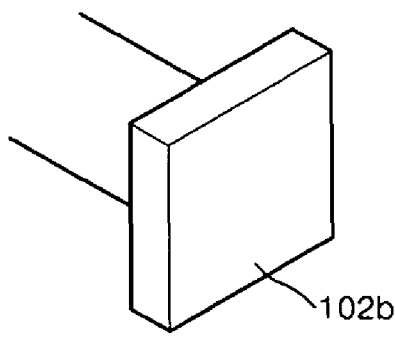

FIGS. 6A and 6B are perspective views of repellers illustrating ion source elements according to the present invention. Referring to FIGS. 6A and 6B, repellers 102a and 102b may be formed of flat rigid plates with a circular shape or a polygonal shape, respectively. As shown in FIG. 2, the size of the repeller 102 may be determined, regardless of its shape, such that the repeller 102 may be spaced a distance L2 from cavity walls 105a and 105b, reducing unnecessary arc discharge.

Figure 7:
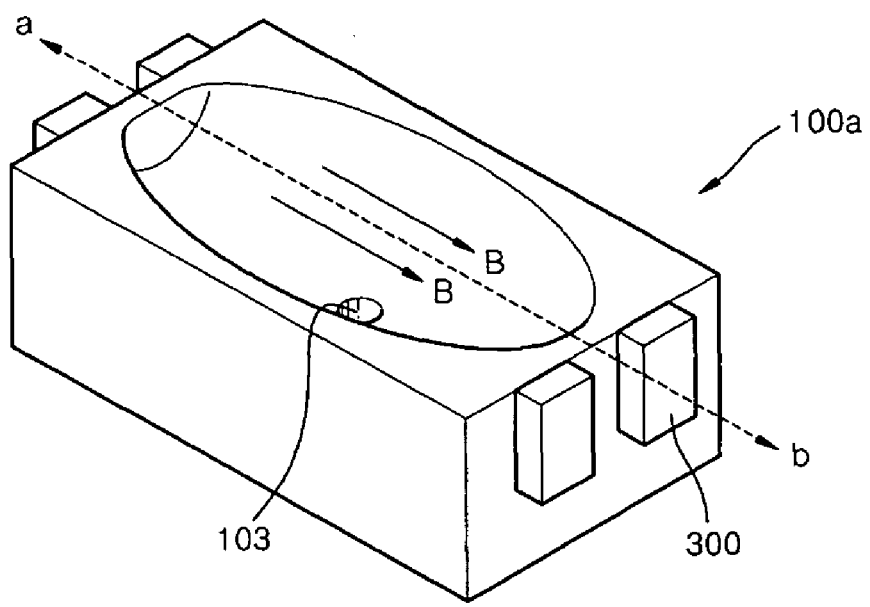

FIG. 7 is a perspective view illustrating an ion source element according to example embodiment of the present invention.

Referring to FIG. 7, an ion source element 500 may further include magnets and/or magnet coils 300 to form a magnetic field (B) in a chamber (e.g., the chamber 100 shown in FIG. 2). The magnets and/or magnet coils 300 may generate a magnetic field (B) in the chamber that may cause electrons emitted from a filament and/or a cathode to move in a spiral path, increasing a traveling distance of the electrons. If the traveling distance of the electrons increases, the possibility of collision between gas molecules and/or electrons may increase. Thus, ion density may be increased in a chamber 100. The current of an ion beam extracted through a beam slit 104 (refer to FIG. 2) may also be increased.

The chamber may be formed of any material that does not become a pollutant during ion implantation. The chamber may be formed of tungsten (W), molybdenum (Mo) and/or graphite. As shown in FIG. 7, in the case where the ion source element 500 may use the magnets and/or magnet coils 300, the chamber may be formed of any non-magnetic material to more easily pass magnetic flux through the chamber. For example, stainless steel may be selected as the non-magnetic material.

Figure 8:
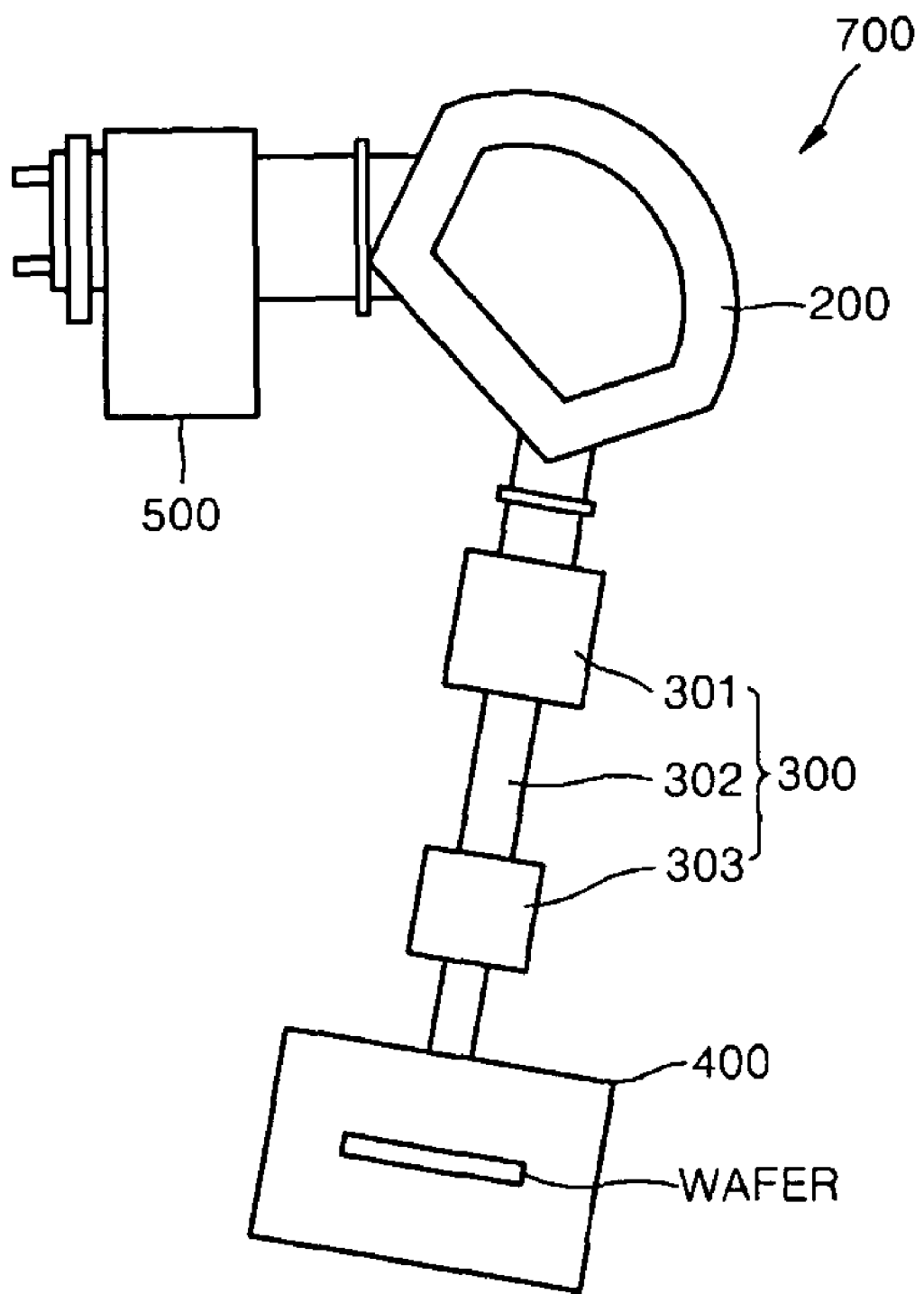

FIG. 8 is a plan view schematically illustrating an ion implanter with an ion source element according to an example embodiment of the present invention.

Referring to FIG. 8, an ion implanter 700 may include the ion source element 500, an extraction electrode (not shown) coupled to a beam slit of the ion source element 500 to extract an ion beam, an analyzer 200 to select ions by using a mass spectrograph, an ion transfer unit 300 to accelerate the ion beam and/or a processing chamber 400 to accommodate a wafer to implant ions into the wafer. The ion transfer unit 300 may include an ion acceleration tube 302, a first field lens 301 and/or a second field lens 302. The first and second field lenses 301 and 303 may be coupled to the ends of the acceleration tube 302 to condense the ion beam transferred from the ion source element 500. For example, the field lenses 301 and 303 may be quadrupole lenses. The analyzer 200, the ion transfer unit 300 and/or the processing chamber 400 may be modified, or changed, to any configuration known to those persons of ordinary skill in the art.

Figure 9:
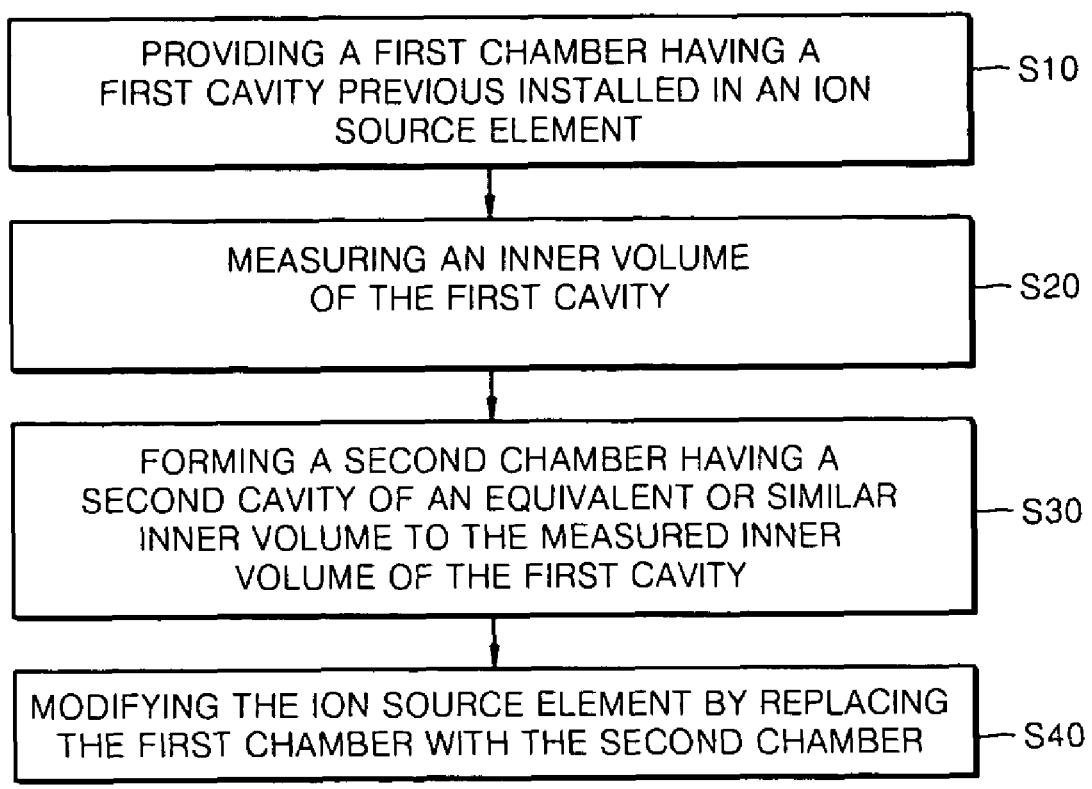

FIG. 9 is a flowchart illustrating a method of modifying an ion source element according to example embodiments of the present invention.

Referring to FIG. 5, a method of modifying an ion source element may include forming a first chamber having a first cavity (S10); measuring an inner volume of the first chamber having a cylindrical or cuboidal inner shape (S20); forming a second chamber having an inner volume equivalent or similar to the measured inner volume of the first chamber (S30);

forming a plurality of inner sections substantially perpendicular to an axis defined through a center of ends of the second chamber, the larger inner sections being near a center of the second chamber and smaller inner sections toward the ends of the second chamber (S40) and/or modifying the ion source element by replacing the first chamber with the second chamber (S50).

The inner section, which may be substantially perpendicular to the axis defined through the centers of the ends of the second chamber, may be circular. Further, the area of the inner sections may decrease symmetrically toward the ends of the chamber.

According to the method of modifying the ion source element, plasma may be concentrated near the center portion of the chamber by improving the ion source element of the ion implanter, increasing the uniformity of the plasma and/or ion density locally.

According to the ion source element and/or the ion implanter with the ion source element described by the example embodiments of the present invention, the chamber may have a reduced volumetric ratio at the end portions to reduce unnecessary arc discharge and/or loss of ions and electrons generated from the end portions, improving the electric stability of the plasma. Further, the chamber may have an increased volumetric ratio at a center portion where ionization may be more active in order to increase ion density and/or ionization efficiency at the center portion of the chamber. Therefore, the lifetime of the ion source element may increase due to the same ion beam current being obtained with a low input power. The plasma may be concentrated more in the center portion of the chamber by forming the cavity of the chamber in an ellipsoidal shape, increasing the uniformity of the plasma while increasing ion density.

Furthermore, according to the method of modifying the ion source element, a more improved ion beam current may be obtained from the same amount of input power by changing the cavity shape of the chamber in the conventional ion implanter, increasing the productivity and/or lifetime of the ion source element.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. An ion source element comprising:
    a chamber having a cavity divided into a plurality of inner sections arranged by size and disposed substantially perpendicular to an axis defined through centers of first and second sides of the chamber;
    a filament disposed near the first side of the chamber to emit thermal electrons;
    a repeller disposed near the second side of the chamber;
    an inlet formed in a first sidewall of the chamber to introduce gas having a dopant species into the chamber; and
    a beam slit formed in a second sidewall of the chamber to extract an ionized species of the gas from the chamber.

2. The ion source element of claim 1, wherein the inner sections are arranged according to size from a center of the cavity toward the first and second sides of the chamber such that an area of the inner section is largest at a center portion of the cavity and becomes smaller toward the first and second side of the chamber.

3. The ion source element of claim 1, wherein the inner sections are circular-shaped.

4. The ion source element of claim 1, wherein an area of the inner sections decrease symmetrically toward the first and second sides of the chamber with respect to the center of the cavity.

5. The ion source element of claim 2, wherein the cavity is an ellipsoid; and the center of the first side and the second side of the chamber are on a major axis of the ellipsoid and opposed to each other.

6. The ion source element of claim 1, wherein the filament extends from outside of the chamber through the first side of the chamber into the cavity; and the repeller extends from the outside of the chamber through the second side of the chamber into the cavity.

7. The ion source element of claim 1, further comprising a cathode extending through the first side of the chamber, the cathode having an internal surface facing the filament and an external surface, the external surface of the cathode emitting thermal electrons toward the cavity of the chamber when the internal surface of the cathode is heated by the thermal electrons emitted from the filament.

8. The ion source element of claim 6, wherein the beam slit has circular or linear shape; and the repeller is a circular or polygonal rigid plate.

9. The ion source element of claim 1, wherein the beam slit is formed in a center portion of the cavity.

10. The ion source element of claim 9, wherein the inlet is formed in the center portion of the cavity such that the inlet and the beam slit are opposite to each other.

11. The ion source element of claim 1, wherein the beam slit has a concave surface facing an outside of the chamber, and a sharp corner with a sloped surface facing an inside of the chamber.

12. The ion source element of claim 1, further comprising a magnet or a magnet coil forming a magnetic field in the chamber directed substantially parallel to the axis defined through the center of the first and second side of the chamber to force the electrons to move in a spiral path.

13. The ion source element of claim 12, wherein the chamber is formed of a non-magnetic material to allow a magnetic flux from the magnet or the magnet coil to pass through the chamber into the cavity of the chamber.

14. The ion source element of claim 13, wherein the non-magnetic material is stainless steel.

15. The ion source element of claim 1, wherein the chamber is formed of a non-pollutant material selected from tungsten (W), molybdenum (Mo) or graphite.

16. An ion source implanter comprising:
    the ion source element of claim 1;
    an extraction electrode extracting ion beams from the ion source element;
    an analyzer selecting the ion beams;
    an ion transfer unit accelerating the selected ion beams; and
    a processing chamber accommodating a wafer to implant the selected ion beams into the wafer.

17. An ion source element comprising:
    a chamber having at least three inner sections disposed parallel to each other, the chamber having a largest cross-sectional area at a center of the chamber and becoming smaller towards walls of the chamber;
    a filament disposed substantially perpendicularly to the at least three inner sections to emit thermal electrons;
    a repeller disposed substantially opposite to the filament, such that the repeller faces the filament;
    an inlet formed in a cavity wall of the chamber to introduce gas having a dopant species into the chamber; and a beam slit formed in the walls of the chamber to extract an ionized species of the gas from the chamber.

18. A method of modifying an ion source element, comprising:

providing a first chamber having a first cavity previously installed in an ion source element;

measuring an inner volume of the first cavity;

forming a second chamber having a second cavity having an equivalent or similar inner volume to the measured inner volume of the first cavity, the second cavity divided into a plurality of inner sections arranged by size and disposed substantially perpendicular to an axis defined through centers of a first and a second end of the second chamber, wherein the first end is opposite the second end; and modifying the ion source element by replacing the first chamber with the second chamber.

19. The method of claim 18, wherein the first cavity has a cylindrical or cuboidal shape, the inner section is circular.

20. The method of claim 18, wherein forming the plurality of inner sections includes:

positioning a first inner section having a first diameter $d_1$, where $d_1 > x$, near a center of the second chamber;

positioning a second inner section having a second diameter $d_2$, $d_2 = x$, between the first inner section and the first end of the second chamber; and positioning a third inner section having a third diameter $d_3$, $d_3 < x$, between the first section and the second end of the second chamber, such that a distance between the third inner section and the second end is less than a distance between the second inner section and the first end.

21. The method of claim 18, wherein the areas of the inner sections symmetrically decrease towards the first and second ends of the second chamber with respect to the center of the second chamber.

* * * * *